(12) United States Patent
Yu

(10) Patent No.: US 6,521,502 B1
(45) Date of Patent: Feb. 18, 2003

(54) SOLID PHASE EPITAXY ACTIVATION PROCESS FOR SOURCE/DRAIN JUNCTION EXTENSIONS AND HALO REGIONS

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/633,207

(22) Filed: Aug. 7, 2000

(51) Int. Cl.[7] .................................................. H01L 21/00
(52) U.S. Cl. ........................................ 438/305; 438/528
(58) Field of Search ................................. 438/302, 303, 438/305, 528

(56) References Cited

U.S. PATENT DOCUMENTS

| | | |
|---|---|---|
| 4,174,521 A | 11/1979 | Neale |
| 4,683,645 A | * 8/1987 | Naguib et al. |
| 4,697,333 A | 10/1987 | Nakahara |
| 4,727,038 A | 2/1988 | Watabe et al. |
| 4,745,082 A | 5/1988 | Kwok |
| 4,784,718 A | 11/1988 | Mitani et al. |
| 4,835,112 A | 5/1989 | Pfiester et al. |
| 4,954,867 A | 9/1990 | Hosaka |
| 4,994,866 A | 2/1991 | Awano |
| 5,017,504 A | 5/1991 | Nishimura et al. |
| 5,019,882 A | 5/1991 | Solomon et al. |
| 5,108,954 A | 4/1992 | Sandhu et al. |
| 5,155,571 A | 10/1992 | Wang et al. |
| 5,258,637 A | 11/1993 | Sandhu et al. |
| 5,264,382 A | 11/1993 | Watanabe |
| 5,270,232 A | 12/1993 | Kimura et al. |
| 5,270,382 A | 12/1993 | Ahmed et al. |
| 5,374,575 A | 12/1994 | Kim et al. |
| 5,391,510 A | 2/1995 | Hsu et al. |
| 5,393,685 A | 2/1995 | Yoo et al. |
| 5,429,956 A | 7/1995 | Shell et al. |
| 5,434,093 A | 7/1995 | Chau et al. |
| 5,461,250 A | 10/1995 | Burghartz et al. |
| 5,478,776 A | 12/1995 | Luftman et al. |
| 5,491,099 A | 2/1996 | Hsu |
| 5,538,913 A | 7/1996 | Hong |
| 5,576,227 A | 11/1996 | Hsu |
| 5,591,653 A | 1/1997 | Sameshima et al. |
| 5,593,907 A | 1/1997 | Anjum et al. |

(List continued on next page.)

FOREIGN PATENT DOCUMENTS

| | | |
|---|---|---|
| JP | 3-248433 | 11/1991 |
| JP | 4-123439 | 4/1992 |
| JP | 5-160396 | 6/1993 |

OTHER PUBLICATIONS

"Silicon Processing for the VLSI Era vol. 1: Process Technology" Wolf, et al., pp. 296–308, 1986.

"Sub–100 nm Gate Length Metal Gats NMOS Transistors Fabricated by a Replacement Gate Process" Chatterjee, et al. IEEE, Dec. 7–10, 1997.

"Sub 50–nm FinFET: PMOS" by Huang, et al. IEEE, 1999.

Journal of Applied Physics, Recrystallization of Implanted Amorphous Silicon Layers I. Electrical Properties of Silicon Implanted with BF+2 or SI ++B+a), by Tsai, et al., vol. 50, No. 1, Jan. 1979.

Ultra–Thin–Body Silicon–On–Insulator MOSFET's for Terabit–Scale Integration Yu, et al. pp. 623–626, date unknown. International Electron Devices Meeting IEDM 97–821 ©1997, IEEE.

*Primary Examiner*—Richard Booth
(74) *Attorney, Agent, or Firm*—Foley & Lardner

(57) ABSTRACT

A method of manufacturing an integrated circuit may include the steps of forming a deep amorphous region and doping the deep amorphous region. The doping of the deep amorphous region can form source and drain regions with extensions. After doping, the substrate is annealed. The annealing can occur at a low temperature.

20 Claims, 2 Drawing Sheets

U.S. PATENT DOCUMENTS

| | | |
|---|---|---|
| 5,595,919 A | 1/1997 | Pan |
| 5,607,884 A | 3/1997 | Byun |
| 5,650,347 A | 7/1997 | Choi |
| 5,654,570 A | 8/1997 | Agnello |
| 5,675,159 A | 10/1997 | Oku et al. |
| 5,683,934 A | 11/1997 | Candelaria |
| 5,716,861 A | 2/1998 | Moslehi |
| 5,736,435 A | 4/1998 | Venkatesan et al. |
| 5,736,446 A | 4/1998 | Wu |
| 5,753,541 A | 5/1998 | Shimizu |
| 5,766,989 A | 6/1998 | Maegawa et al. |
| 5,793,090 A | 8/1998 | Gardner et al. |
| 5,801,075 A | 9/1998 | Gardner et al. |
| 5,811,323 A | 9/1998 | Miyasaka et al. |
| 5,814,544 A | 9/1998 | Huang |
| 5,817,558 A | 10/1998 | Wu |
| 5,824,586 A | 10/1998 | Wollesen et al. |
| 5,825,066 A | 10/1998 | Buynoski |
| 5,851,869 A | 12/1998 | Urayama |
| 5,856,225 A | 1/1999 | Lee et al. |
| 5,858,843 A | 1/1999 | Doyle et al. |
| 5,885,886 A | 3/1999 | Lee |
| 5,888,888 A | 3/1999 | Talwar et al. |
| 5,904,530 A | 5/1999 | Shin |
| 5,908,307 A | 6/1999 | Talwar et al. |
| 5,910,015 A | 6/1999 | Sameshima et al. |
| 5,915,180 A | 6/1999 | Hara et al. |
| 5,915,182 A | 6/1999 | Wu |
| 5,915,183 A | 6/1999 | Gambino et al. |
| 5,915,196 A | 6/1999 | Mineji |
| 5,937,297 A | 8/1999 | Peridous |
| 5,953,602 A | 9/1999 | Oh et al. |
| 5,953,615 A | 9/1999 | Yu |
| 5,953,616 A | 9/1999 | Ahn |
| 5,972,754 A | 10/1999 | Ni et al. |
| 5,981,345 A | 11/1999 | Ryum et al. |
| 5,985,726 A | 11/1999 | Yu et al. |
| 5,998,288 A | 12/1999 | Gardner et al. |
| 5,998,828 A | 12/1999 | Ueno et al. |
| 6,004,852 A | 12/1999 | Yeh et al. |
| 6,008,111 A | 12/1999 | Fushida et al. |
| 6,015,739 A * | 1/2000 | Gardner et al. ............ 438/287 |
| 6,020,024 A * | 2/2000 | Maiti et al. ............ 427/248.1 |
| 6,022,785 A | 2/2000 | Yeh et al. |
| 6,030,863 A | 2/2000 | Chang et al. |
| 6,037,204 A | 3/2000 | Chang et al. |
| 6,037,640 A | 3/2000 | Lee |
| 6,072,222 A | 6/2000 | Nistler |
| 6,080,645 A | 6/2000 | Pan |
| 6,100,171 A | 8/2000 | Ishida |
| 6,103,609 A | 8/2000 | Lee et al. |
| 6,110,783 A | 8/2000 | Burr |
| 6,130,144 A | 10/2000 | Verret |
| 6,133,082 A | 10/2000 | Masuoka |
| 6,136,616 A | 10/2000 | Fulford et al. |
| 6,159,813 A | 12/2000 | Ahmad et al. |
| 6,174,778 B1 * | 1/2001 | Chen et al. ............ 438/302 |
| 6,180,476 B1 | 1/2001 | Yu |
| 6,184,097 B1 | 2/2001 | Yu |
| 6,200,869 B1 | 3/2001 | Yu et al. |
| 6,225,173 B1 | 5/2001 | Yu |
| 6,225,176 B1 | 5/2001 | Yu |
| 6,232,622 B1 | 5/2001 | Hamada |
| 6,248,637 B1 | 6/2001 | Yu |
| 6,251,761 B1 * | 6/2001 | Rodder et al. ............ 438/591 |
| 6,255,174 B1 | 7/2001 | Yu |
| 6,265,293 B1 | 7/2001 | Yu |
| 6,268,640 B1 | 7/2001 | Park et al. |
| 6,271,095 B1 | 8/2001 | Yu |
| 6,319,798 B1 * | 11/2001 | Yu ............ 438/527 |
| 6,333,244 B1 | 12/2001 | Yu |

* cited by examiner

SOLID PHASE EPITAXY ACTIVATION PROCESS FOR SOURCE/DRAIN JUNCTION EXTENSIONS AND HALO REGIONS

CROSS REFERENCE TO RELATED APPLICATIONS

This patent application is related to U.S. application Ser. No. 09/187,890, by Yu et al., entitled "A Method of Fabricating an Integrated Circuit with Ultra-Shallow Drain/Source Extensions"; and U.S. application Ser. No. 09/187,630, by Yu, entitled "Dual Amorphization Implant Process for Ultra-Shallow Drain and Source Extensions"; both filed on Nov. 6, 1998. In addition, this patent application is related to U.S. application Ser. No. 09/255,546, by Yu, entitled "A Locally Confined Deep Pocket Process for ULSI MOSFETS"; U.S. application Ser. No. 09/255,604, by Yu, entitled "A Process for Forming Ultra-Shallow Source/Drain Extensions"; filed on Feb. 22, 1999 and U.S. application Ser. No. 09/384,121, by Yu, entitled "CMOS Transistors Fabricated in Optimized RTA Scheme", filed on Aug. 27, 1999. The present application is also related to U.S. application Ser. No. 09/491,422, by Yu, entitled "CMOS Fabrication Process with Differential Rapid Thermal Anneal Scheme", filed on Jan. 26, 2000. The present application is also related to U.S. application Ser. No. 09/597,623, by Yu, entitled "Dual Amorphization Process Optimized to Reduce Gate Line Over-Melt" and U.S. application Ser. No. 09/597,098, by Yu, entitled "Process Utilizing a Cap Layer Optimized to Reduce Gate Line Over-Melt" filed on Jun. 20, 2000, and U.S. Ser. No. 09/599,270 filed by Yu, entitled "A Solid Phase Epitaxy Process for Manufacturing Transistors Having Silicon/Germanium Channel Regions" and U.S. Ser. No. 09/618,857 entitled "CMOS Manufacturing Process with Self-Amorphized Source/Drain Junctions and Extensions" filed by Yu on Jul. 18, 2000. All applications are assigned to the assignee of the present invention.

FIELD OF THE INVENTION

The present invention relates generally to the field of integrated circuits (ICs) and to methods of manufacturing integrated circuits. More particularly, the present invention relates to a low thermal budget method of manufacturing an integrated circuit utilizing solid phase epitaxy.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs) or MOSFETs. The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Thus, controlling short channel effects is important to assuring proper semiconductor operation.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacers.

As transistors disposed on ICs become smaller, CMOS fabrication processes have utilized channel doping techniques. One technique utilizes shallow pocket regions which effectively suppress the short-channel effect (which degrades the robustness of the transistor to random process variations). Shallow pocket regions are provided in a conventional CMOS pocket implant process. The implant process is performed after the gate structure is fabricated and before the silicide layers are formed. The shallow pocket regions are not deeper than the source and the drain regions.

Another channel doping technique utilizes a two-dimensional doping implant, which is achieved by forming deep pocket implant regions, wherein the channel-doping profile in the lateral direction is non-uniform and the channel-doping profile in the vertical direction is a super-steep retrograded channel-doping profile. The two-dimensional channel-doping profile is critical to scaling (i.e., proportional operation) and structural elements in the ultra-small dimensions of the MOSFET). The deep pocket implant regions are conventionally formed after the extensions, drain and source regions and spacers are formed. The deep pocket results in a "halo-like" structure (e.g., halo regions). It is desirous to maintain the halo regions in a localized portion of the substrate.

As the critical dimensions of transistors continue to be reduced (e.g., to achieve a gate length of 50 nm and below), control of thermal budget in IC fabrication is very important. The term 'thermal budget' refers to the temperature applied to the substrate during the fabrication process. The formation of ultra-shallow source/drain extensions and a super-localized halo profile for the halo regions is critical to control short-channel effects. In conventional CMOS processes, high temperature (e.g., greater than 1000° C.) rapid thermal annealing (RTA) is used to activate the dopant in the source region, drain region, halo region, etc. However, the high temperature RTA can adversely affect the formation of the source, drain and halo regions.

With continually-shrinking MOSFET dimensions, high-k materials (i.e., materials having a high dielectric constant or k, such as, $Al_2O_3$, $TiO_2$, $ZrO_2$, etc.) can also be used as gate insulators. Unfortunately, high-k materials tend to react with silicon at high temperatures. As such, the processing temperature has to be kept low (e.g., <800° C.) if high-k materials are to be used as gate dielectrics. Accordingly, conventional CMOS processes cannot readily employ high-k gate dielectrics due to the adverse affects of the high temperature RTA.

Thus, there is a need for a manufacturing process for CMOS integrated circuits in which post-gate processing temperatures are lower such that high-k materials used as gate insulators do not react with silicon. Further, there is a need for a transistor fabrication process which uses a differential anneal strategy. Even further, there is a need for using an amorphous implant before the halo region, the shallow source/drain extensions and deep source/drain contact junctions are formed. Even further still, there is a need for an IC manufacturing process in which highly activated source/drain extensions, deep source/drain contact junctions and halo regions are created.

SUMMARY OF THE INVENTION

An exemplary embodiment relates to a method of manufacturing a transistor. The method includes providing a gate structure, providing a deep amorphous implant, providing a shallow dopant implant, providing a tilted angle halo implant, and forming a pair of spacers abutting the gate structure. The method also includes providing a deep source/drain dopant implant and annealing at a low temperature. The annealing at the low temperature activates dopants from the shallow extension dopant implant, the halo dopant implant, and the deep source/drain dopant implant via solid phase epitaxy.

Another exemplary embodiment relates to a process of forming a transistor on a substrate. The substrate includes a gate conductor. The process includes forming a deep amorphous region, doping a shallow portion of the deep amorphous region, doping a halo region at least partially in the deep amorphous region, and doping a deep portion of the deep amorphous region for deep source and drain regions. The method also includes recrystallizing the deep amorphous region.

Yet another embodiment relates to a method of manufacturing a transistor on an ultra-large scale integrated circuit. The method includes steps of amorphizing a deep amorphous region in a substrate, implanting a dopant into a shallow portion of the deep amorphous region of the substrate to form a source extension and a drain extension, implanting a dopant into a deep portion of the deep amorphous region to form a deep source and drain region, and recrystallizing the deep amorphous region.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
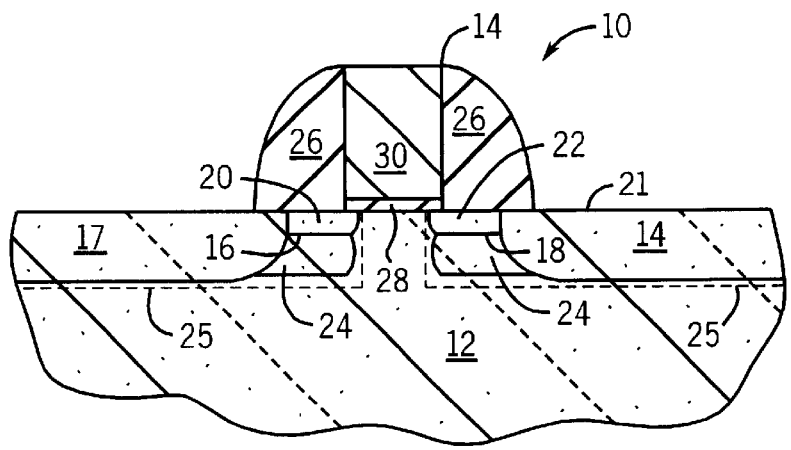
FIG. 1 is a cross-sectional view of a portion of an integrated circuit fabricated in accordance with an exemplary embodiment of the present invention.

Referring to FIG. 1, a portion 10 of an integrated circuit (IC) or chip includes a substrate 12, a gate stack 14, a source region 16, a drain region 18, and halo regions 24. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is any of a variety of semiconductor materials, such as, silicon. Substrate 12 is preferably a bulk P-type substrate or a silicon-on-insulator substrate. Substrate 12 can be single crystal silicon oriented in a 100 direction.

In an exemplary embodiment, gate stack 14 includes a polysilicon gate electrode or conductor 30 disposed over a gate dielectric or insulator 28, such as thermally grown silicon dioxide. Gate stack 14 is aligned between active regions in substrate 12. Active regions are areas in portion 10 including impurities or dopants such as a p-type dopant (e.g., boron) or an n-type dopant (e.g., phosphorous). Gate stack 14 is located between spacers 26. Spacers 26 are preferably silicon dioxide ($SiO_2$) structures which abut lateral sides of gate structure or stack 14 and are provided at least partially over source region 16 and drain region 18.

Source region 16 and drain region 18 are formed by ion implantation and include a source extension 20, a drain extension 22, a deep source region 17 and a deep drain region 19. Halo regions 24 are located below extensions 20 and 22. The dopants in halo regions 24, source region 16 and drain region 18 are advantageously activated by thermal activation or annealing in a low thermal budget process as described below with reference to FIGS. 1–6.

Source extension 20 is a shallower extension of source region 16. Drain extension 22 is a shallower extension of drain region 18. Preferably, source extension 20 and drain extension 22 extend at least partially below gate stack 14. In one embodiment, these extensions are 20–40 Å deep (e.g., below a top surface 21 of substrate 12) and the width of each extension region is 30–50 Å. In one embodiment, deep source/drain regions 17 and 19 are 80–160 Å deep.

The dopants for regions 16 and 18 used can be phosphorous (P), arsenic (As) or antimony (Sb) for an n-channel MOSFET and Boron (B), or boron di-flouride ($BF_2$) for a p-channel MOSFET. Preferably, regions 16 and 18 can have a concentration of $1 \times 10^{19}$ to $1 \times 10^{21}$ dopants per cubic centimeter.

Halo regions 24 share a border with extensions 20 and 22 and regions 17 and 19. Halo regions 24 can extend 40–80 Å below top surface 21 of substrate 12. Regions 24 preferably have a concentration of $1 \times 10^{18}$–$5 \times 10^{18}$ dopants per cubic centimeter.

Halo regions 24 are at least partially disposed in deep amorphuos regions 25. In the embodiment of FIG. 1, regions 24 are completely contained in deep amorphous region 25. The profile of regions 24 is preferably super localized.

Preferably, a very low temperature (e.g., 500–600° C.) RTA or furnace anneal is used to activate the dopants in deep source region 17, deep drain region 19, halo regions 24, source extension 20, and drain extension 22. The very low temperature can activate the dopants because source 16, drain 18 and halo regions 24 are provided in a deep amorphous region 25. The dopants in regions 24 have an opposite conductivity type to that of regions 16 and 18. The very low temperature (e.g., 500–600° C.) anneal is enough to recrystallize the source region 16 and drain region 18 including extensions 20 and 22. Dopant inside the regions 16 and 18 and 20 and 22 become well activated due to the mechanism of solid-phase epitaxy. By using a low thermal budget, steep junctions can be obtained, which is desirable for transistors with small dimensions. Although deep amorphous region 25 is shown in FIG. 1 by a dashed line for illustration, region 25 is recrystallized as single crystal material after annealing. Region 25 preferably extends 100–200 nm below top surface 21 of substrate 12.

The method of forming portion 10 is described below with reference to FIGS. 1–6. The method advantageously forms portion 10 including deep source/drain regions 17 and 19, extensions 20 and 22, and halo regions 24 with high dopant activation. High activation is achieved via solid phase epitaxy.

Figure 2:
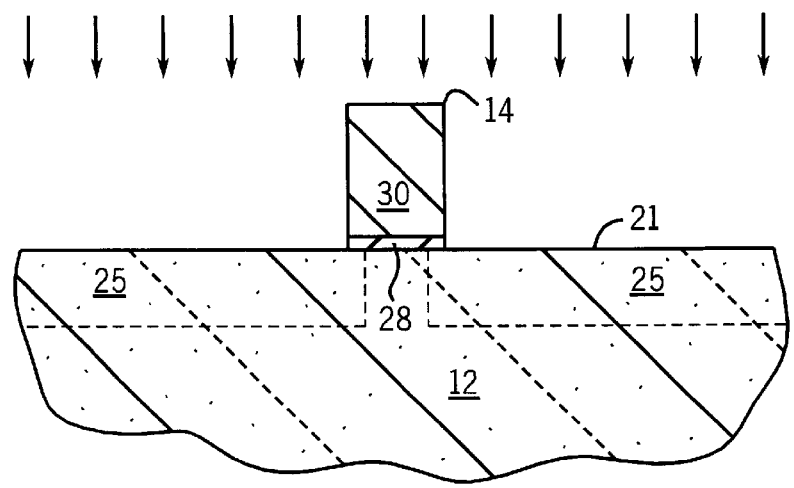
FIG. 2 is a cross-sectional view of the portion of the integrated circuit illustrated in FIG. 1, showing a deep amorphization implant step.

In FIG. 2, a cross-sectional view of portion 10 illustrates substrate 12 after a conventional CMOS fabrication process is followed to form a gate stack 14 including gate insulator 28 and gate conductor 30. Conductor 30 can be polysilicon or polysilicon germanium material. The polysilicon material can be undoped or doped to be highly conductive. Alternatively, conductor 36 can be a metal material.

Conductor 30 can be deposited by chemical vapor deposition (CVD), and insulator 28 can be thermally grown silicon dioxide. Preferably, conductor 30 is 1,000–2,000 Å thick undoped polysilicon material and is 35–150 nm wide. Insulator 28 is 35–150 nm wide and 15–30 Å thick. Insulator 28 can be silicon dioxide, nitride, or a high-k dielectric material.

After conductor 30 is provided, a deep amorphization implant forms deep amorphous regions 25 in substrate 12. Regions 25 preferably extend 100–200 nm below top surface 21 of substrate 12 and are exclusive of an area underneath structure 14.

Various amorphization processes can be utilized to form regions 25. Preferably, an ion implantation process utilizing a neutral ion, such as, silicon (Si), germanium (Ge), and/or xenon (Xe) forms region 25. Preferably, Ge ions are accelerated to an energy of 10–50 KeV at a dose of 3~6×$10^{14}$ cm$^{-2}$ to form regions 25. Ion implantation devices, such as, devices manufactured by Varian Company, Palo Alto, Calif., Genius Company, and Applied Materials, Inc. can be used to provide the deep amorphization implant as well as the dopant implants discussed below. The Ge ions change the single crystal structure of substrate 12 into an amorphous structure for regions 25. Subsequent doping of substrate 12 for regions 16 and 18 (FIG. 1) and regions 24 are confined in regions 25.

Conductor 30 can also be amorphized when regions 25 are formed. Alternatively, a cap material such as silicon nitride or silicon oxynitride can be provided above conductor 30 to protect it during the deep amorphization implant.

Figure 3:
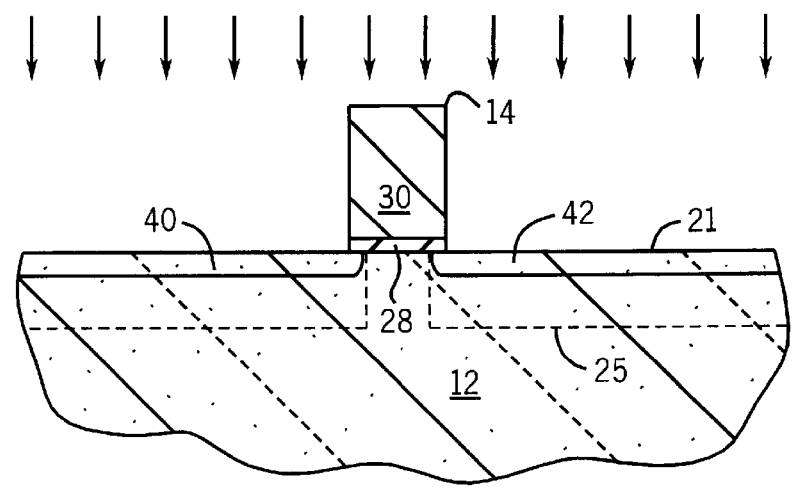
FIG. 3 is a cross-sectional view of the portion of the integrated circuit illustrated in FIG. 2, showing a shallow source/drain extension dopant implant step.

In FIG. 3, portion 10 includes shallow source extension layer 40 and shallow drain extension 42 that are formed via a source/drain extension dopant implant. Layers 40 and 42 are shown as stippled areas in FIG. 3 and correspond to extensions 20 and 22 (FIG. 1). The source/drain extension implant is projected to a center depth of 10–15A below top surface 21 and layers 40 and 42 are 20–30A deep. In an exemplary embodiment, non-neutral dopants, such as, P, B, $BF_2$, As, or Sb are used.

Shallow source/drain extension layers 40 and 42 have a concentration of 1×$10^{19}$ to 1×$10^{21}$ dopants per cubic centimeter. The source/drain extension dopant implant is performed at a dose of 1×$10^{14}$~1×$10^{15}$ cm$^{-2}$ at energies of 1~5 KeV Layers 40 and 42 are contained within region 25.

Alternatively, the tilted halo dopant implant (FIG. 4) can be performed before the source/drain extension implant.

Conductor 30 can be covered by a cap material such as silicon nitride or silicon oxynitride to protect conductor 30 from the implantation of ions for layers 40 and 42. Alternatively, conductor 30 can be doped during the formation of layers 40 and 42.

Figure 4:
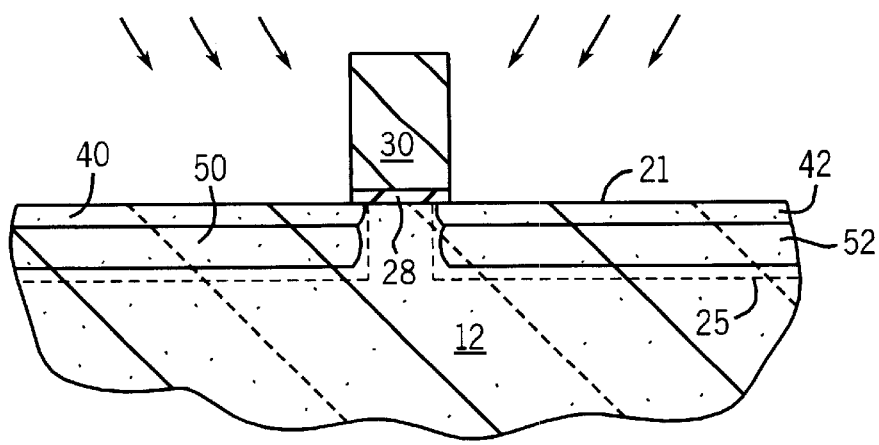
FIG. 4 is a cross-sectional view of the portion of the integrated circuit illustrated in FIG. 3, showing a tilted angle halo dopant implant step.

In FIG. 4, a halo dopant implant is performed to form halo layers 50 and 52. Layers 50 and 52 correspond to halo regions 24 (FIG. 1). The halo dopant implant is performed with non-neutral dopants at a dose of 1×$10^{13}$–1×$10^{14}$ dopants per square centimeter at energies of 5–50 KeV. The non-neutral dopants have an opposite conductivity type to the dopants used for layers 40 and 42. Layers 50 and 52 extend from a depth of 20–40 nm to a depth of 40 to 80 nm. Layers 50 and 52 can be formed in a tilted angle implant process (10–30 degrees) so that layers 50 and 52 extend beneath gate structure 14. The projection of the tilted angle halo dopant implant is centered at 20–40 nm.

Figure 5:
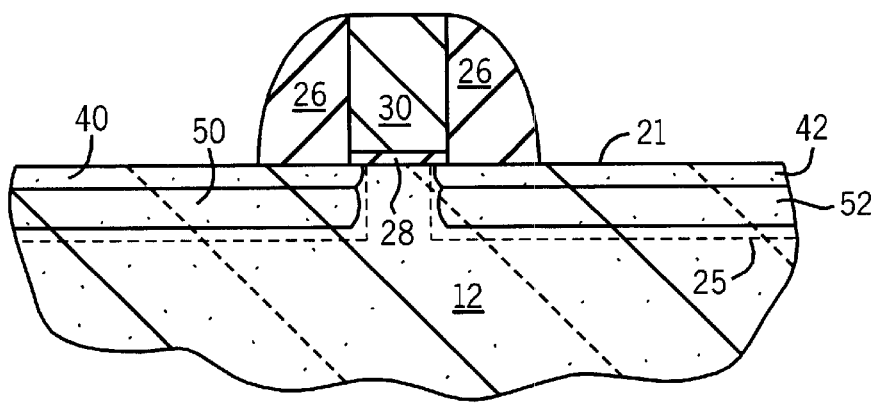
FIG. 5 is a cross-sectional view of the portion of the integrated circuit illustrated in FIG. 4, showing a spacer formation step and a deep source/drain dopant implant step.

In FIG. 5, dielectric spacers 26 are formed by plasma enhanced chemical vapor deposition (PECVD) and etch-back processes. The PECVD process is preferably a very low temperature (less than 400° C.) deposition process. Spacers 26 can be an oxide or nitride material. The low temperature deposition technique does not change the crystalline structure of region 25.

Figure 6:
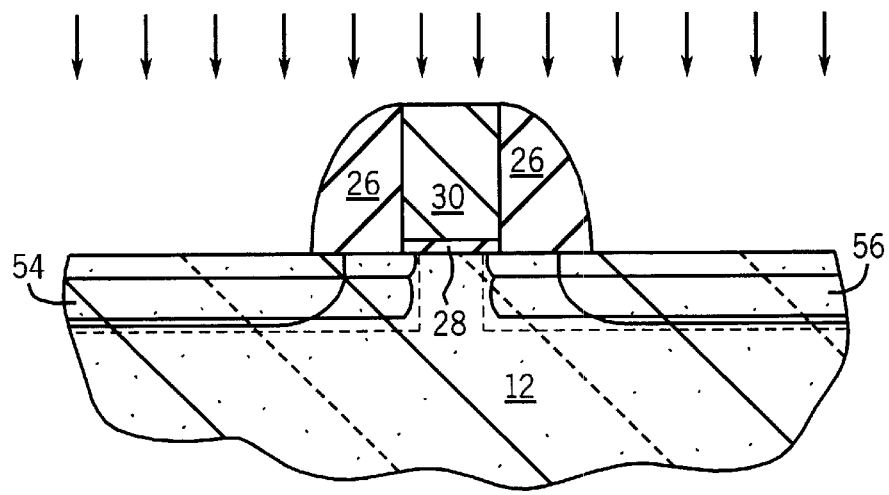
FIG. 6 is a cross-sectional view of the portion of the integrated circuit illustrated in FIG. 5, showing an annealing step.

In FIG. 6, a deep source/drain dopant implant is provided at a dose of 1×$10^{15}$~1×$10^{16}$ cm$^{-2}$ and energies of 10–100 KeV to form deep source/drain layers 54 and 56. Deep source/drain layers 54 and 56 are shown in FIG. 6 as stippled areas and correspond to regions 17 and 19 (FIG. 1). In one embodiment, non-neutral dopants such as P, $BF_2$, As, or Sb are used. The dopants can be charged to an energy level of 10–100 KeV to implant layers 54 and 56.

The deep source/drain dopant implant in FIG. 6 is deeper than the tilted angle halo dopant implant (FIG. 4) and the shallow source/drain extension implant (FIG. 3). In an exemplary embodiment, the depth of this deep source/drain dopant implant has a center of projection between 40–80 nm. Conductor 30 can also be doped during this step.

In FIG. 1, shallow source and drain extensions 20 and 22 (layers 40 and 42) (FIG. 4), deep source and drain regions 17 and 19 (layers 54 and 56 FIG. 6) halo regions 24 (layers 50 and 52) (FIG. 4) are annealed to activate the dopant and to recrystallize region 25. The annealing process changes the structure of regions 25 from an amorphous state to a single crystalline state (e.g., melts regions 25 which subsequently recrystallizes). Preferably, a solid phase epitaxy technique is utilized to crystallize regions 25. Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystalline semiconductor (silicon, silicon/germanium, or germanium) start layer. Solid phase eiptaxy is usually achieved by heating the amorphous silicon. Preferably, a very low temperature (e.g., 500–600° C. furnace) rapid thermal anneal (RTA) is utilized. Substrate 12 acts as a seed or start layer for recrystallization of region 25. Preferably, the solid phase epitaxy is performed at a very low temperature so that the thermal budget of the process is not adversely affected.

As described above, the very low temperature (e.g., 500–600° C.) RTA is preferably applied to recrystallize deep amorphous region 25 (layers 40, 42, 50, 52, 54 and 56) and form regions 16, 18, 20, 22, and 24 (FIG. 1). In one embodiment, a solid-phase epitaxy process occurs in which the dopants in deep source and drain regions 17 and 19 (layers 54 and 56) (FIG. 6) halo regions 24 (layers 50 and 52) (FIG. 4) and shallow source and drain extensions 20 and 22 (layers 40 and 42 (FIG. 4) achieve high activation (e.g., 80–100 percent of dopants, substantially all of the dopants).

Conventional CMOS fabrication process steps can complete the manufacturing of the IC. In one embodiment, conductor 30 can also be recrystallized during the annealing steps and dopants in conductor 30 can be highly activated.

The process described with reference to FIGS. 1–6 is particularly advantageous in light of the need for smaller integrated circuits. As smaller MOSFETs are designed, high-k materials, such as, $A_{i2}O_3$, $TiO_2$, and $ZrO_2$ are used as the gate insulator. Unfortunately, high-k materials react with silicon at high temperatures. As such, lower temperatures must be used. In an exemplary embodiment of the circuit fabrication process described above, the reaction of high-k materials with high temperatures is avoided by the use of a deep amorphous region and solid phase epitaxy process.

While the embodiments illustrated in the FIGURES and described above are presently preferred, it should be understood that these embodiments are offered by way of example only. Other embodiments may include, for example, different techniques for selectively annealing various integrated circuit structures. The invention is not limited to a particular embodiment, but extends to various modifications, combinations, and permutations that nevertheless fall within the scope and spirit of the appended claims.

What is claimed is:

1. A method of manufacturing a transistor, the method comprising in the following order:

providing a gate structure;

providing a deep amorphous implant;

providing a shallow extension dopant implant;

providing a tilted angle halo dopant implant, the tilted angle halo implant being the only halo implant step;

forming a pair of spacers abutting the gate structure;

providing a deep source/drain dopant implant; and annealing at a very low temperature, the annealing recrystallizing an amorphous region formed by the deep amorphous implant and activating dopants from the shallow extension dopant implant, the halo dopant implant, and the deep source/drain dopant implant via solid phase epitaxy wherein the deep amorphous implant is performed before the deep source/drain dopant implant and the deep source/drain dopant implant is performed after the tilted halo dopant implant.

2. The method of claim 1, wherein the deep amorphous implant creates an amorphous region at least 100 nm deep.

3. The method of claim 1, wherein the step of annealing comprises providing a furnace anneal to recrystallize an amorphous region formed by the deep amorphous implant.

4. The method of claim 1, wherein the gate structure comprises a gate insulator of a high-k material.

5. The method of claim 1, wherein the shallow extension dopant implant has a center projected to a depth of 10–15 Å deep.

6. The method of claim 5, wherein the step of annealing is at a temperature below 600° C.

7. The method of claim 6, wherein the temperature is at least between approximately 500° C. and 600° C.

8. The method of claim 1, wherein the tilted angle halo dopant implant is performed at an angle of 10–30 degrees.

9. A process of forming a transistor on a substrate, the substrate including a gate conductor, the process comprising in the following order:

forming a deep amorphous region;

doping a shallow portion of the deep amorphous region for shallow source and drain extensions;

doping a halo region at least partially in the deep amorphous region with a tilted implant, the halo region sharing a top border with a bottom border of the source extension;

doping a deep portion of the deep amorphous region for deep source and drain regions; and recrystallizing the deep amorphous region, wherein the deep amorphous region is formed before the deep source and drain regions and the deep source and drain regions are formed after the halo region.

10. The process of claim 9, wherein the step of recrystallizing comprises a rapid thermal anneal (RTA).

11. The process of claim 10, wherein the RTA uses a temperature substantially between 500° and 600° C.

12. The process of claim 9, wherein the doping the halo region utilizes a tilted angle implant.

13. The process of claim 9, wherein the doping the shallow region is an implant projected to a depth of less than 16 Å.

14. A method of manufacturing a transistor on an ultra-large scale integrated circuit, the method comprising the steps of:

amorphizing a deep region in a substrate, the deep region having a depth of between 100 and 200 nm;

implanting a dopant into a shallow portion of the deep region of the substrate to form source and drain extensions;

implanting a single halo region in a single step in the substrate before the first implanting step, the halo region being implanted at a dose between $1 \times 10^{13}$–$1 \times 10^{14}$ dopants per square centimeter at an energy level of 5–50 KeV;

implanting a dopant into a deep portion of the deep region to form deep source and drain regions; and recrystallizing the deep region, and activating the deep source and drain regions in a very low temperature process, wherein the deep region is formed before the deep source and drain regions and the deep source and drain regions are formed after the halo region is formed.

15. The method of claim 14, wherein the halo region is formed by a tilted implant after the source and drain extensions.

16. The method of claim 14, wherein the halo region is shallower than the deep source and drain regions.

17. The method of claim 14, wherein recrystallizing comprises applying a rapid thermal anneal between approximately 500° and 600° C.

18. The method of claim 14, further comprising doping the substrate with a tilt angle implant to form a halo region.

19. The method of claim 18, wherein the first implanting has a projection depth with a center between 10–15 Å.

20. The method of claim 14, wherein the gate insulator is any one of $Ai_2O_3$, $TiO_2$, and $ZrO_2$.

* * * * *